US006426681B1

(12) United States Patent
Amini

(10) Patent No.: US 6,426,681 B1
(45) Date of Patent: Jul. 30, 2002

(54) HIGH POWER ADJUSTABLE RF COUPLING LOOP

(76) Inventor: Behrouz Amini, Micro-Fission Technology P.O. Box 32033, Knoxville, TN (US) 37930

( * ) Notice: Subject to any disclaimer, the term of this patent is extended or adjusted under 35 U.S.C. 154(b) by 0 days.

(21) Appl. No.: 10/002,347

(22) Filed: Oct. 23, 2001

Related U.S. Application Data

(60) Provisional application No. 60/253,545, filed on Nov. 28, 2000.

(51) Int. Cl.[7] .................................................. H03H 5/00

(52) U.S. Cl. ..................... 333/24 R; 333/230; 315/500; 315/5.41

(58) Field of Search ............................... 333/24 R, 230, 333/231, 232, 229, 226, 263; 315/500, 5.41, 5.42

(56) References Cited

U.S. PATENT DOCUMENTS

| | | | | | |
|---|---|---|---|---|---|
| 2,773,215 | A | * | 12/1956 | Miller | 315/41 |
| 2,794,931 | A | * | 6/1957 | Gardner | 313/446 |
| 4,231,001 | A | * | 10/1980 | Hutchinson | 333/110 |
| 4,980,662 | A | * | 12/1990 | Simon et al. | 333/134 |
| 5,731,269 | A | * | 3/1998 | Clermont | 333/230 |

* cited by examiner

*Primary Examiner*—Justin P. Bettendorf
*Assistant Examiner*—Dean Takaoka

(57) ABSTRACT

A high power adjustable rf coupling loop which is used to interface a transmission line to a resonant cavity is described. The coupling loop is made entirely of metallic parts and therefore is ideal for high power rf applications. Contrary to all existing loops it does not require water cooling Among the unique features of this loop is the fact that it is adjustable. Subsequently the combined impedance of the loop and cavity can be adjusted to match perfectly with the line impedance rendering almost zero reflected power.

11 Claims, 2 Drawing Sheets

HIGH POWER ADJUSTABLE RF COUPLING LOOP

This non-provisional application is a continuation of a previously filed provisional application with application No. 60/253,545 and the filing date Nov. 28, 2000.

CROSS-REFERENCES TO RELATED APPLICATION

Not Applicable.

FEDERALLY SPONSORED RESEARCH OR DEVELOPMENT

Not Applicable.

REFERENCE TO A MICROFICHE APPENDIX

Not Applicable.

BACKGROUND OF THE INVENTION

The present invention relates generally to resonance acceleration of charged particles and specifically to excitation of resonant cavities of a resonance accelerator with a radio-frequency electromagnetic wave. The invented device is a high power coupling loop which is used to interface a resonant cavity to a transmission line.

In its broadest classification, there are two types of charged particle accelerators; electrostatic, and resonance. In an electrostatic accelerator charged particles gain energy as they move between two regions that are held at two different electric potentials, for example two electrodes. Associated with the electric potential is the electric field E. The integral of the electric field along the path traversed by the particle that connects the two regions is equal to the potential difference between the two region. The accelerating force is equal to qE, where q is the electric charge of the particle. In an electrostatic accelerator, as the name "electrostatic" suggests, the electric potential is independent of time. Accelerating charged particles to megavolt energies requires a very large electric filed. The convenient unit in this context is megavolt/cm. Because both isolating materials and practical vacuum break down under strong electric fields the limit of the electrostatic acceleration is from several to around 10 MeV. The resonance accelerator, however, does not have this limitation.

Resonance accelerators like all electromagnetic devices owes their existence to the genius of J. C. Maxwell who added the displacement current to the Ampere's law and implied new physical phenomena which has been substantiated in all details by experiment. Accordingly, a time varying magnetic fields give rise to electric fields and vice-versa. One of the device which is directly related to the present invention is the resonant cavity. In its simplest form a resonant cavity is a hollow volume enclosed by metallic walls. The hollow volume, as predicted by the Maxwell equations, supports electromagnetic oscillations in which the energy in the cavity oscillates between the electric and magnetic fields. In a resonance accelerator the particles are accelerated by electric field of the cavity or an array of cavities. Since both magnitude and direction of the electric field of a resonant cavity changes with time there must be an exact correlation between the movement of accelerating particles and the frequency of the resonant cavity: any time that the particles reaches the cavity field the electric field of the cavity should be in a direction to accelerate the particles. (The alternative is deceleration of charged particles which results in amplification of the cavity fields.) The term "resonance" in resonance accelerator refer to this requirement.

The resonant frequency of almost all cavities that are used for particle acceleration fall in the radio-frequency (rf for short) range. To resonate a cavity and keep it in the excited state the rf power from an rf amplifier must be continuously fed into the cavity. The transfer of power from the rf amplifier to the cavity is by a transmission line which connects the rf amplifier to the cavity. The end of the transmission line on the cavity side is connected to a coupling device which is housed inside the cavity. The coupling device interfaces the transmission line to the resonant cavity and plays a vital role in both operation of the accelerator and protection of the rf circuit elements.

From practical point of view the coupling device must possess some key features. First, the reflected rf power, the power that reflects back to the rf amplifier, should not exceed more than a few percent of the rf forward power. Here, the primary issue is not efficient use of the power but protection of the downstream components—the power amplifiers. A large amount of reflected power can easily ruin circuit elements on its pass. Second, the physical size of the coupling device should be much smaller that the physical size of the cavity. This condition warrants that the effect of the coupling device on the cavity is not more than a small perturbation. This requirement comes from the fact that in accelerator applications a resonant cavity with a large Q is desired. (The Q of the cavity is defined by $$Q=\omega_o \text{ Stored energy/Power loss}$$

where $\omega_o$ is the angular frequency of the cavity.) A coupling device, however, reduces Q of the cavity. This reduction in Q gets worse as the physical size of the coupling device becomes larger.

With regard to the features of the present invention which will be discussed shortly, all existing high power coupling devices are nonadjustable and water cooled. The fact that they are nonadjustable means that many of them with different physical size and shape must be built and tried until one of them can provide a tolerable reflected power. The fact that they are water cooled means they are prone to leak water in the vacuum where they operate and the water cooling adds additional cost and maintenance. From these considerations it is highly desirable to come up with an adjustable coupling device that also does not use water cooling. Finally, a coupling device should be purely metallic. Any nonmetal part, such as ceramic or teflon, which is sometimes used for electrical isolation of a coupling device components will melt under high power.

The device to be described in the next section is the first adjustable high power rf coupling loop. Because it is adjustable it provides perfect impedance matching and subsequently renders almost zero reflected power. Moreover, it fulfills all other requirements discussed in this section; it is purely metallic, relatively small, and does not use water cooling. This coupling loop has been installed in an accelerator and has shown excellent performance.

SUMMARY OF THE INVENTION

A new coupling loop at radio frequency (rf) is presented which is used for interfacing a transmission line to a resonant cavity. All parts of the loop are metallic and subsequently the loop is ideal for high power rf applications. Its key parts comprises of two parallel metallic rods and a sliding clamps. One of the rod is connected to the center line of the transmission line and the other is hard soldered to the return; the ground. The two rods are shorted by the sliding clamp. The impedance matching is achieved by simply adjusting the position of the clamp. This is the first adjustable coupling loop and also the first loop that does not use water cooling. Since the loop is adjustable it can be adjusted to produce practically zero reflected power which is a highly desirable feature in resonance accelerators.

Figure 1:
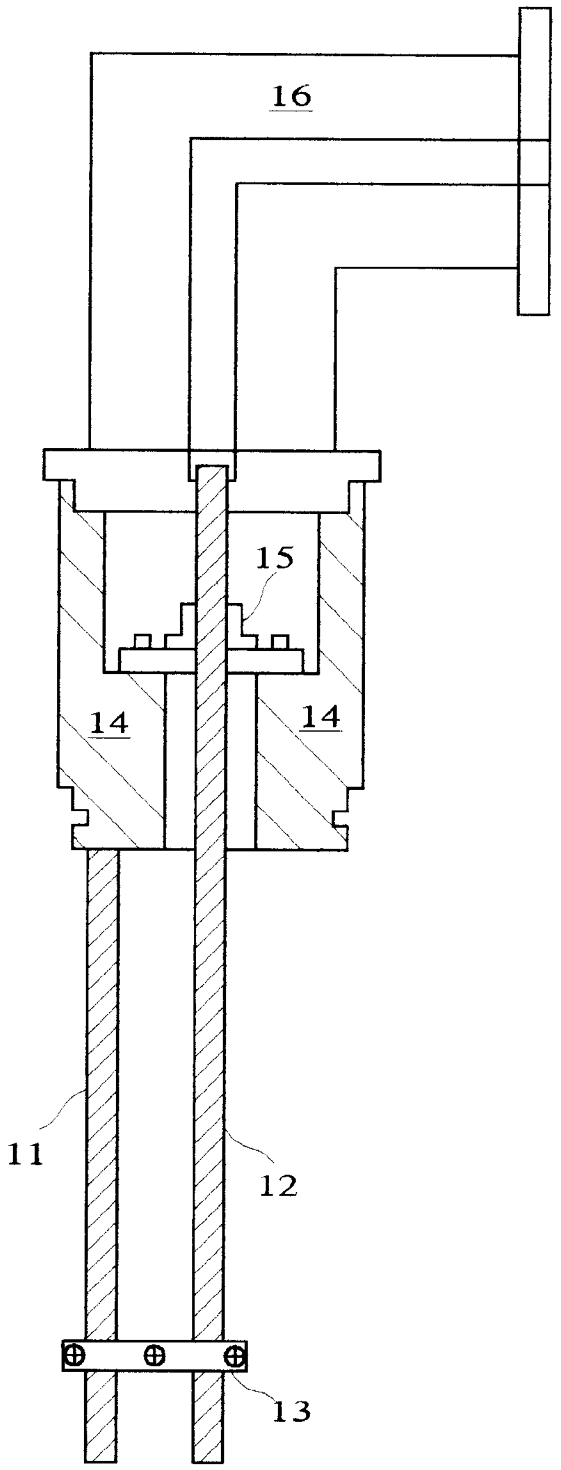
FIG. 1 is a schematic view of the coupling loop.

| Reference Numeral In Drawings |
|---|
| 10 rf coupling loop |
| 11 metallic rod, the return side |
| 12 metallic rod that connects to the central line of the transmission line |
| 13 adjustable metallic clamp |
| 14 holder |
| 15 high voltage vacuum feed through |
| 16 standard 50-ohm elbow |
| 21 D-stem |
| 22 D-plate (electrode) |
| 23 resonant cavity |
| 30 cavity boundary (walls) |

DETAILED DESCRIPTION OF THE INVENTION

FIG. 1 shows a cross section view of the coupling loop. The main components of the loop are the two parallel quarter-inch solid metallic rods 11 land 12, clamp 13, and metallic structure 14. We refer to this metallic structure as the holder. Rod 12 is part of the commercially available high voltage feed through. This rod is electrically isolated from holder 14 by structure 15 and also vacuum sealed by structure 15. One end of rod 12 is connected to the center conductor of 50-ohm elbow 16. A transmission line, not shown in FIG. 1, connects elbow 16 to an rf amplifier. Rod 11 is hard soldered to holder 14. Both rod 11 and holder 14 are the return part of the circuit interfacing the transmission line and are electrically connected to the outer shield of the transmission line through elbow 16.

Figure 2:
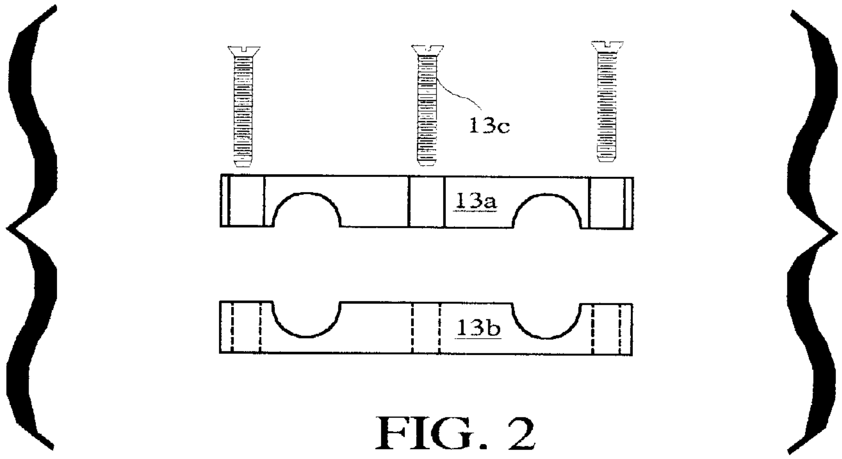
FIG. 2 is a schematic view of the adjustable clamp.

Clamp 13 electrically shorts rod 11 and 12. As shown in FIG. 2, excluding mounting screws 13*c*, clamp 13 comprises of two top and bottom symmetrical pieces, 13*a* and 13*b*, respectively. The diameters of half-circle grooves in 13*a* and 13*b* are chosen to snugly house parallel rods 11, and 12. The screw holes in 13*b* are tapped and the screw holes 13*a* are straight, untapped. The position of clamp 13, please see FIG. 1, is adjusted by loosening the three mounting screws. Upon loosening 13*c*, the clamp can slide back and fourth along the two rods. As will be described shortly, the location of clamp 13 is the major determining factor for impedance matching.

Holder 14 also functions as a heat sink for rods 11, 12, and clamp 13. It should be noted that the amount of heat generated in the coupling loop is not significant. All previous designs of coupling loops is based on the assumption that without a coolant the loop will melt. This is not the case, however. There is no reason to support that the coupling loop should get any hotter than, for example, any part of the transmission line. Yet the transmission line stands the heat without direct cooling. This assessment of the situation that the loop should not get hot is substantiated by the present design of the loop. As a result, using the holder as a heat sink is more than adequate for keeping the loop temperature down.

From the functional point of view the coupling loop should provide perfect impedance matching. Specifically, the loop should function such that the combined impedance of the resonant cavity and the loop be equal to the impedance of the transmission line connected to the loop. When this happens the reflected rf power is zero and all forward power will be absorbed by the resonant cavity. For the sake of discussion, we assume that the impedance of the transmission line connecting the rf amplifier to the coupling loop is 50 ohm. This is generally true, since all commercially available high power transmission lines are 50 ohm. With this assumption the reflected power vanishes if the impedance of the combination of the coupling loop and the resonant cavity as seen by the transmission line is 50 ohm. In that case the incident wave in the transmission line does not see any discontinuity and subsequently is not reflected back Denoting the voltage across the coupling loop by $V_1$ and the current through the coupling loop by $I_1$ and the combined impedance of the coupling loop and resonant cavity as seen by the transmission line by $Z_1$ we have the relation $Z_1 \equiv V_1/I_1$. This expression is the definition of $Z_1$. Both $V_1$ and $I_1$ depend on the geometry of the coupling loop, geometry of the cavity, location and orientation of the coupling loop with respect to the cavity. In general, $Z_1$ has a reactive and a resistive component. As noted above we require that the reactive component be equal to zero and the resistive component be equal to 50 ohm. There are two parameters that can be adjusted to fulfill these two requirements. They are the position of clamp 13, please see FIG. 1, and the orientation of the coupling loop with respect to the cavity, please see FIG. 2. The latter parameter is varied by rotating the coupling loop in its mounting location. When the above two requirements are met the reflected power vanishes.

As noted above, fulfilling the above two requirements are equivalent to elimination of the reflected power which in turn depends on the exact location of clamp 13 and if necessary small rotation of the loop. A simple device called voltage standing wave ratio analyzer, or VSWR analyzer for short, which is a standard tool in rf technology can determine the orientation of the loop and location of the clamp. The VSWR analyzer is a low power rf generator which has a dial to show the reflected power in terms of VSWR which is defined by $$VSWR = \frac{1+\rho_v}{1-\rho_v},$$

where $\rho_v$ is the magnitude of the reflection coefficient. When $\rho_v$ is zero the reflected power vanishes and VSWR converges to 1. The reflected power is measured by connecting the VSWR analyzer to elbow 16 of FIG. 3. As noted above, the value of VSWR=1 indicates zero reflected power. Therefore, the object is to vary the location of the clamp very slightly and systematically until VSWR converges to 1. In general, the orientation of the loop should be chosen such that the rectangle defined by rod 11, 12 and clamp 13 intercept the maximum flux of the cavity mode.

Figure 3:
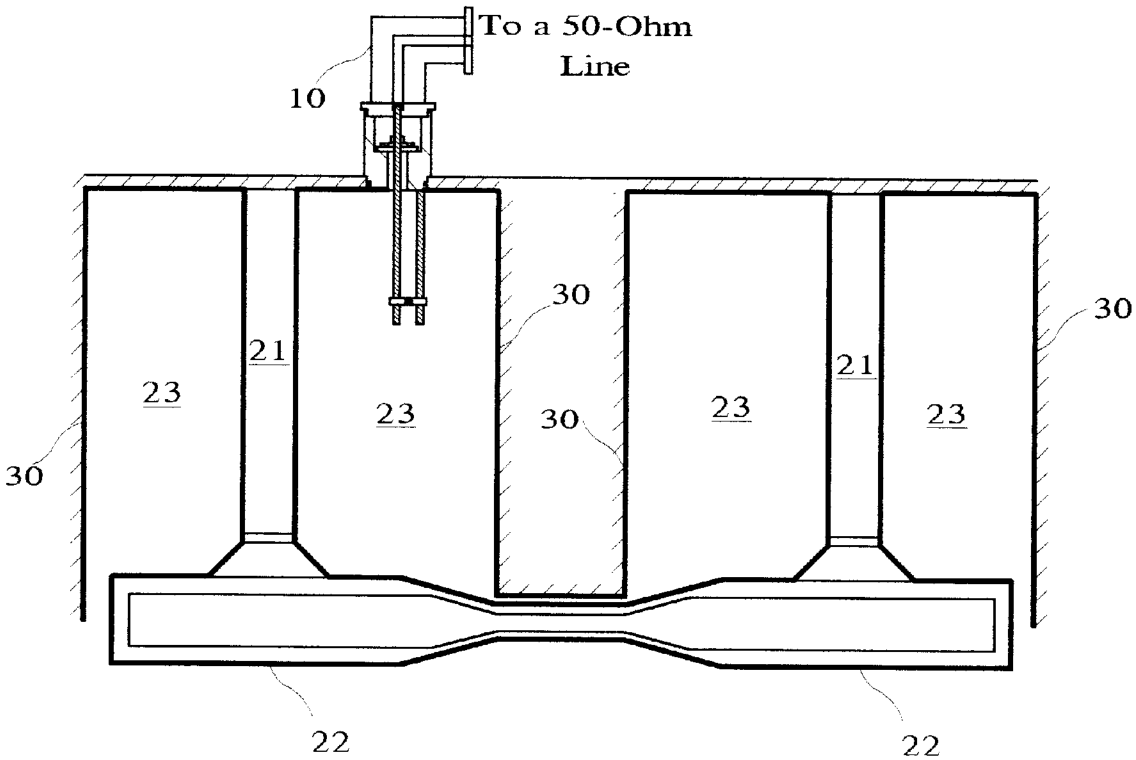
FIG. 3 is a sectional view of the coupling loop and resonant cavities of an accelerator in which the coupling loop has been installed.

The present invention has been installed in a cyclotron called RDS-11 which is marketed by SIEMENS. The schematic of this cyclotron is shown in FIG. 3. The cyclotron operates with a forward rf power of around 10 kWatts and the operating frequency of the resonant cavity is around 73

MHz. By adjusting the position of clamp 13 the reflected power of the present invention can be set as low as 20 to Watts. This gives a reflected power of (20/10000)×100=0.2%, which is very small.

Finally, the actual dimensions of the coupling loop is as follows. Rod 11 is about 4.5 inches long and the nominal dimensions of the other parts can be determined from FIG. 1 based on the dimension of rod 11.

What is claimed is:

1. A radio-frequency (rf) coupling loop for interfacing the resonant cavity of a resonance accelerator with a power transmission line, the coupling loop comprising:

a support body mountable within a wall of the resonant cavity of the resonance accelerator;

a pair of elongated metallic rods wherein each rod has two opposite end portions and the rods are supported by the support body in parallel relation with and insulated from one another so that when the support body is mounted within the wall of the resonant cavity, one end portion of each rod extends into the resonant cavity, one of the rods being connectable to the central line of the power transmission line for conducting power therefrom, and the other of the rods being electrically connectable to the support body; and electrically-conductive clamping means clampable about the pair of rods so that the clamping means extends between the two end portions of the rods which extend into the resonant cavity and which are adjustable in position along the length of the extending rod end portions to thereby adjust the amount of rf power which is reflected from the coupling loop to the power transmission line.

2. The coupling loop as defined in claim 1 wherein the clamping means is constructed of metal.

3. The coupling loop as defined in claim 1 wherein the clamping means includes a pair of clamp members having opposing portions which are positionable about and engage the extending rod end portions when clamped thereabout.

4. The coupling loop as defined in claim 3 wherein the opposing portions of the clamp members are movable toward and away from one another between a loosened condition at which the clamping means can be slidably moved along the length of the rods and a tightened condition at which the clamping means is fixed in position along the length of the rods.

5. The coupling loop as defined in claim 4 wherein the clamping means includes a rotatable screw for holding the opposing clamp members together and which, when rotated in one rotational direction, permits the clamp members to move to a loosened condition and which, when rotated in the direction opposite the one rotational direction, moves the clamp members to the tightened condition.

6. The coupling loop as defined in claim 1 wherein the support body is adapted to be sealingly mounted within the wall of the resonant cavity of the resonance accelerator.

7. A method for adjusting the amount of power which is reflected from a coupling loop disposed within the resonant cavity of a resonance accelerator to a radio-frequency (rf) transceiver, the method comprising the steps of:

providing a coupling loop for interfacing the resonant cavity of the resonance accelerator with a power transmission line wherein the coupling loop includes a) a support body mountable within a wall of the resonant cavity of the resonance accelerator;

b) a pair of elongated metallic rods wherein each rod has two opposite end portions and the rods are supported by the support body in parallel relation with and insulated from one another so that when the support body is mounted within the wall of the resonant cavity, one end portion of each rod extends into the resonant cavity, one of the rods being connectable to the central line of the power transmission line which is in turn connected to the rf transceiver for conducting power therefrom, and the other of the rods being electrically connectable to the support body; and c) electrically-conductive clamping means clampable about the pair of rods so that the clamping means extend between the two end portions of the rods which extend into the resonant cavity and which are adjustable in position along the length of the extending rod end portions;

mounting the coupling loop within a wall of the resonant cavity of the resonance accelerator so that the two end portions of the rods extend into the resonant cavity;

measuring the amount of rf power which is reflected from the coupling loop to the rf transceiver;

removing the coupling loop from the wall of the resonant cavity; and adjusting the position of the clamping means along the length of the extending rod end portions so that when re-mounted within the wall of the resonant cavity, the amount of rf power which is reflected from the coupling loop to the rf transceiver is altered.

8. The method as defined in claim 7 wherein the step of adjusting is followed by the steps of re-mounting the coupling loop within the wall of the resonance accelerator and then measuring the amount of rf power which is reflected from the coupling loop to the rf transceiver.

9. The method as defined in claim 7 wherein the clamping means of the coupling loop includes a pair of opposing clamp members having opposing portions which are positioned in a clamped condition about extending rod portions, and the step of adjusting includes the steps of:

loosening the clamp members from the clamped condition about the extending rod end portions so that the clamp members are permitted to be moved along the length of the extending rod end portions;

moving the clamp members along the length of the extending rod end portions to an alternative position therealong; and returning the clamp members to a clamped condition about the extending rod end portions.

10. The method as defined in claim 9 wherein the opposing portions of the clamp members are movable toward and away from one another between a loosened condition at which the clamping means can be slidably moved along the length of the rods and a tightened condition at which the clamping means is fixed in position along the length of the rods, and the steps of loosening the clamp members and returning the clamp members to the clamped condition are effected by moving the clamping members toward and away from one another.

11. The method as defined in claim 10 wherein the clamping means includes a rotatable screw for holding the opposing clamp members together and which, when rotated in one rotational direction, permits the clamp members to move to a loosened condition and which, when rotated in the direction opposite to the one rotational direction, moves the clamp members to the tightened condition, and the steps of loosening the clamp members and returning the clamp members to the clamped condition are effected by rotating the screws in one or the opposite rotational direction.

* * * * *